United States Patent
Ranish

(10) Patent No.: US 10,661,223 B2
(45) Date of Patent: May 26, 2020

(54) ANNEAL CHAMBER WITH GETTER

(71) Applicant: Applied Materials, Inc., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 301 days.

(21) Appl. No.: 15/651,669

(22) Filed: Jul. 17, 2017

(65) Prior Publication Data

US 2018/0345215 A1    Dec. 6, 2018

Related U.S. Application Data

(60) Provisional application No. 62/514,447, filed on Jun. 2, 2017.

(51) Int. Cl.
| | |
|---|---|
| *B01D 53/82* | (2006.01) |
| *H01L 21/67* | (2006.01) |
| *H05B 3/00* | (2006.01) |
| *B01D 53/46* | (2006.01) |
| *B01D 53/04* | (2006.01) |
| *B01D 53/26* | (2006.01) |

(52) U.S. Cl.
CPC ......... *B01D 53/82* (2013.01); *B01D 53/0407* (2013.01); *B01D 53/261* (2013.01); *B01D 53/46* (2013.01); *H01L 21/6719* (2013.01); *H01L 21/67109* (2013.01); *H01L 21/67115* (2013.01); *H01L 21/67248* (2013.01); *H05B 3/0047* (2013.01); *B01D 2253/102* (2013.01); *B01D 2253/108* (2013.01); *B01D 2253/116* (2013.01); *B01D 2253/204* (2013.01); *B01D 2257/104* (2013.01); *B01D 2257/108* (2013.01); *B01D 2257/80* (2013.01)

(58) Field of Classification Search
CPC .... B01D 53/82; B01D 53/46; B01D 53/2253; B01D 53/116; B01D 2257/108; B01D 2253/102; B01D 2253/108
USPC ........ 219/209, 270, 532, 536; 438/149, 200, 438/478
See application file for complete search history.

(56) References Cited

U.S. PATENT DOCUMENTS

| | | | |
|---|---|---|---|
| 5,020,069 A * | 5/1991 | McNeil | H01S 3/036 372/59 |
| 5,242,559 A | 9/1993 | Giorgi | |
| 5,778,682 A | 7/1998 | Ouellet | |

(Continued)

FOREIGN PATENT DOCUMENTS

| | | |
|---|---|---|
| EP | 0926258 A2 | 6/1999 |
| WO | 1997017542 A1 | 5/1997 |
| WO | 1998003987 A1 | 1/1998 |

OTHER PUBLICATIONS

International Search Report from PCT/US2017/042866 dated Feb. 27, 2018.

*Primary Examiner* — Thien S Tran
(74) *Attorney, Agent, or Firm* — Patterson + Sheridan LLP

(57) ABSTRACT

A method and apparatus for thermally processing a substrate is described. The apparatus includes a thermal processing chamber having an interior volume which includes a top portion and a side wall. The apparatus also include a getter assembly comprising a getter configured as a wire disposed in the top portion and extending into the interior volume proximal to the side wall.

20 Claims, 13 Drawing Sheets

(56) References Cited

U.S. PATENT DOCUMENTS

| | | | |
|---|---|---|---|
| 6,142,742 A * | 11/2000 | Krueger | C23C 14/564 |
| | | | 417/48 |
| 6,241,477 B1 * | 6/2001 | Brezoczky | C23C 14/564 |
| | | | 417/48 |
| 6,299,746 B1 | 10/2001 | Conte et al. | |
| 6,361,618 B1 | 3/2002 | Nulman | |
| 6,589,599 B1 | 7/2003 | Conte et al. | |
| 6,635,116 B1 | 10/2003 | Mayeda et al. | |
| 7,378,618 B1 | 5/2008 | Sorabji et al. | |
| 2002/0160553 A1 * | 10/2002 | Yamanaka | H01L 21/02524 |
| | | | 438/149 |
| 2005/0044802 A1 | 3/2005 | Bellman et al. | |
| 2006/0188069 A1 * | 8/2006 | Anno | H05G 1/04 |
| | | | 378/130 |
| 2007/0048200 A1 * | 3/2007 | Takao | C30B 25/10 |
| | | | 422/186.04 |
| 2010/0255184 A1 | 10/2010 | Yamazaki et al. | |
| 2011/0048953 A1 * | 3/2011 | Kuo | C25D 7/0607 |
| | | | 205/50 |
| 2015/0072460 A1 | 3/2015 | Palm et al. | |
| 2016/0148787 A1 * | 5/2016 | Burgess | C23C 14/34 |
| | | | 204/192.16 |

* cited by examiner

ANNEAL CHAMBER WITH GETTER

CROSS-REFERENCE TO RELATED APPLICATIONS

This application is a utility application which claims benefit of U.S. Provisional Patent Application No. 62/514,447, filed Jun. 2, 2017, which is incorporated herein by reference in its entirety.

BACKGROUND OF THE DISCLOSURE

Field of the Invention

The embodiments herein generally relate to semiconductor processing chambers. More specifically, the embodiments relate to a getter applied to a semiconductor processing chamber and a method for use of the same.

Description of the Background Art

Integrated circuits have evolved into complex devices that can include millions of transistors, capacitors, and resistors on a single chip. The evolution of chip design continually requires faster circuitry and greater circuit density that demand increasingly precise fabrication processes. One fabrication process frequently used is ion implantation.

Ion implantation is particularly important in forming transistor structures on semiconductor substrates and may be repeated many times during chip fabrication. During ion implantation, a semiconductor substrate, typically comprising a silicon material and/or a silicon containing substrate, is bombarded by a beam of electrically charged ions, commonly called dopants. Ion implantation changes the properties of the material in which the dopants are implanted in order to achieve a particular level of electrical performance. Dopant concentration may be determined by controlling the number of ions in a beam of energy projected on the substrate and the number of times the substrate passes through the beam. The dopants are accelerated to an energy level that will enable the dopants to penetrate the silicon material or implant into the substrate at a desired depth. The energy level of the beam typically determines the depth at which the dopants are placed.

During ion implantation, the implanted substrate may develop a high level of internal stress. In order to relieve the stress and further control the resulting properties of the implanted substrate, the substrate is typically subjected to a thermal process, such as annealing. Post-ion implantation annealing is typically performed in a rapid thermal processing (RTP) chamber.

Rapid thermal processing (RTP) is a well-developed technology for fabricating semiconductor integrated circuits. RTP is a process in which the substrate is irradiated with high intensity electromagnetic radiation in an RTP chamber to quickly heat the substrate to a relatively high temperature to thermally activate a process in the substrate. Once the substrate has been thermally processed, the radiant energy is removed and the substrate cools. RTP is an energy efficient process because the chamber in which the RTP is performed is not heated to elevated temperature required to process the substrate. In an RTP process, only the substrate and some of the substrate support is heated. Thus, the processed substrate is not in thermal equilibrium with the surrounding environment, namely the chamber.

Some substrates to be annealed require an atmosphere free of oxidants for optimum results, e.g., absence of secondary phases, interfacial roughness. Metal silicide formation for contacts in semiconductors can fall into this category. This may require flowing large amounts of ultra-high purity inert gas or unreactive gas to flush out oxidants which may be brought in with the substrate, leak into the chamber, permeate into the chamber, or be released (volatized) from the chamber walls or components during heating.

Unfortunately, flowing large amounts of high-pressure inert gas is wasteful and may not be possible to perform during early stages of substrate heating when absorbed oxidants on the substrate and chamber walls are easier to remove because it may impart undesirable thermal gradients on the substrate.

Accordingly, what is needed in the art is an effective method of removing oxidants and moisture from an RTP chamber without employing ultra-high purity inert gas.

SUMMARY

In one embodiment, an apparatus for use in a thermal processing chamber is provided. The apparatus includes a thermal processing chamber having an interior volume which includes a top portion and a side wall. The apparatus includes a getter assembly comprising a getter configured as a wire disposed in the top portion and extending into the interior volume proximal to the side wall.

BRIEF DESCRIPTION OF THE DRAWINGS

So that the manner in which the above recited features of the embodiments herein are attained and can be understood in detail, a more particular description of the invention, briefly summarized above, may be had by reference to the embodiments thereof which are illustrated in the appended drawings.

Figure 1:
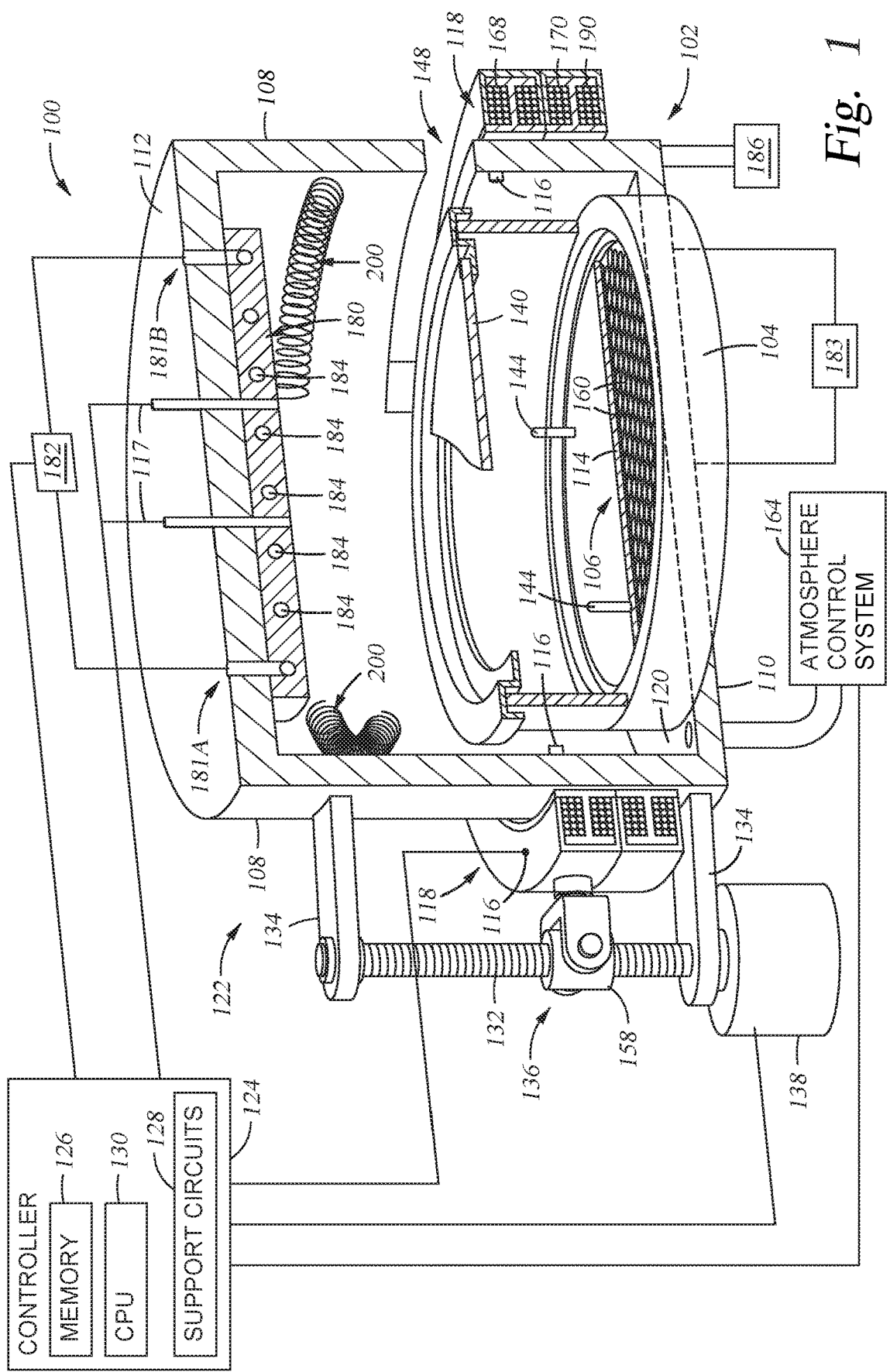
FIG. 1 illustrates a cross-sectional view of a rapid thermal processing chamber according to certain embodiments described herein.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide a thermal processing chamber for processing a substrate that includes a getter material within the chamber.

FIG. 1 is a cross-sectional view of a rapid thermal processing (RTP) chamber 100 according to certain embodiments described herein. The RTP chamber 100 includes a contactless or magnetically levitated substrate support 104, a chamber body 102, having side walls 108, a bottom portion 110, and a top portion 112 defining an interior volume 120. The side walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). In one embodiment, the substrate support 104 is annular and the chamber 100 includes a radiant heat source 106 disposed in an inside diameter of the substrate support 104. Examples of RTP chambers that may be used include the VULCAN® and RADIANCE® thermal processing chambers available from Applied Materials, Inc., of Santa Clara, Calif. Thermal processing chambers from other manufacturers may also benefit from embodiments described herein.

A getter assembly 200 is disposed in the top portion 112 of the interior volume 120 of the RTP chamber 100. The getter assembly 200 is described in greater detail in connection with FIGS. 2-5.

The RTP chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly coupled to a coolant source 183. The coolant source 183 may be one or a combination of water, ethylene glycol, nitrogen ($N_2$), and helium (He). The housing may be made of a copper material or other suitable material having suitable coolant channels formed therein for flow of the coolant from the coolant source 183. Each tube 160 may contain a reflector and a high-intensity lamp assembly or an IR emitter from which is formed a honeycomb-like pipe arrangement. This close-packed hexagonal arrangement of pipes provides radiant energy sources with high-power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by the controller 124 may varied to enhance the radial distribution of energy from the tubes 160. Dynamic control of the heating of the substrate 140 may be effected by the one or more temperature sensors 117 (described in more detail below) adapted to measure the temperature across the substrate 140.

A stator assembly 118 circumscribes the side walls 108 of the chamber body 102 and is coupled to one or more actuator assemblies 122 that control the elevation of the stator assembly 118 along the exterior of the chamber body 102. In one embodiment (not shown), the RTP chamber 100 includes three actuator assemblies 122 disposed radially about the chamber body, for example, at about 120° angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough that is coupled to a fluid source 186, which may include water, ethylene glycol, nitrogen ($N_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the RTP chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes.

The RTP chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

In one embodiment, each of the actuator assemblies 122 generally comprise a precision lead screw 132 coupled between two flanges 134 extending from the side walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102.

The RTP chamber 100 also includes one or more sensors 116, which are generally adapted to detect the elevation of the substrate support 104 (or substrate 140) within the interior volume 120 of the chamber body 102. The sensors 116 may be coupled to the chamber body 102 and/or other portions of the RTP chamber 100 and are adapted to provide an output indicative of the distance between the substrate support 104 and the top portion 112 and/or bottom portion 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to and a central axis of the RTP chamber 100 and/or the radiant heat source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top portion 112 or coupled to the side walls 108, although other locations within and around the chamber body 102 may be suitable, such as coupled to the stator 118 outside of the RTP chamber 100. In one embodiment, one or more sensors 116 may be coupled to the stator 118 and are adapted to sense the elevation and/or position of the substrate support 104 (or substrate 140) through the side walls 108. In this embodiment, the side walls 108 may include a thinner cross-section to facilitate positional sensing through the side walls 108.

The thermal processing chamber 100 also includes a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

As described herein, the thermal processing chamber 100 is adapted to receive a substrate in a "face-up" orientation, wherein the deposit receiving side or face of the substrate is oriented toward the cooling block 180 and the "backside" of the substrate is facing the radiant heat source 106. The "face-up" orientation may allow the energy from the radiant heat source 106 to be absorbed more rapidly by the substrate 140 as the backside of the substrate is typically less reflective than the face of the substrate.

Figure 2:
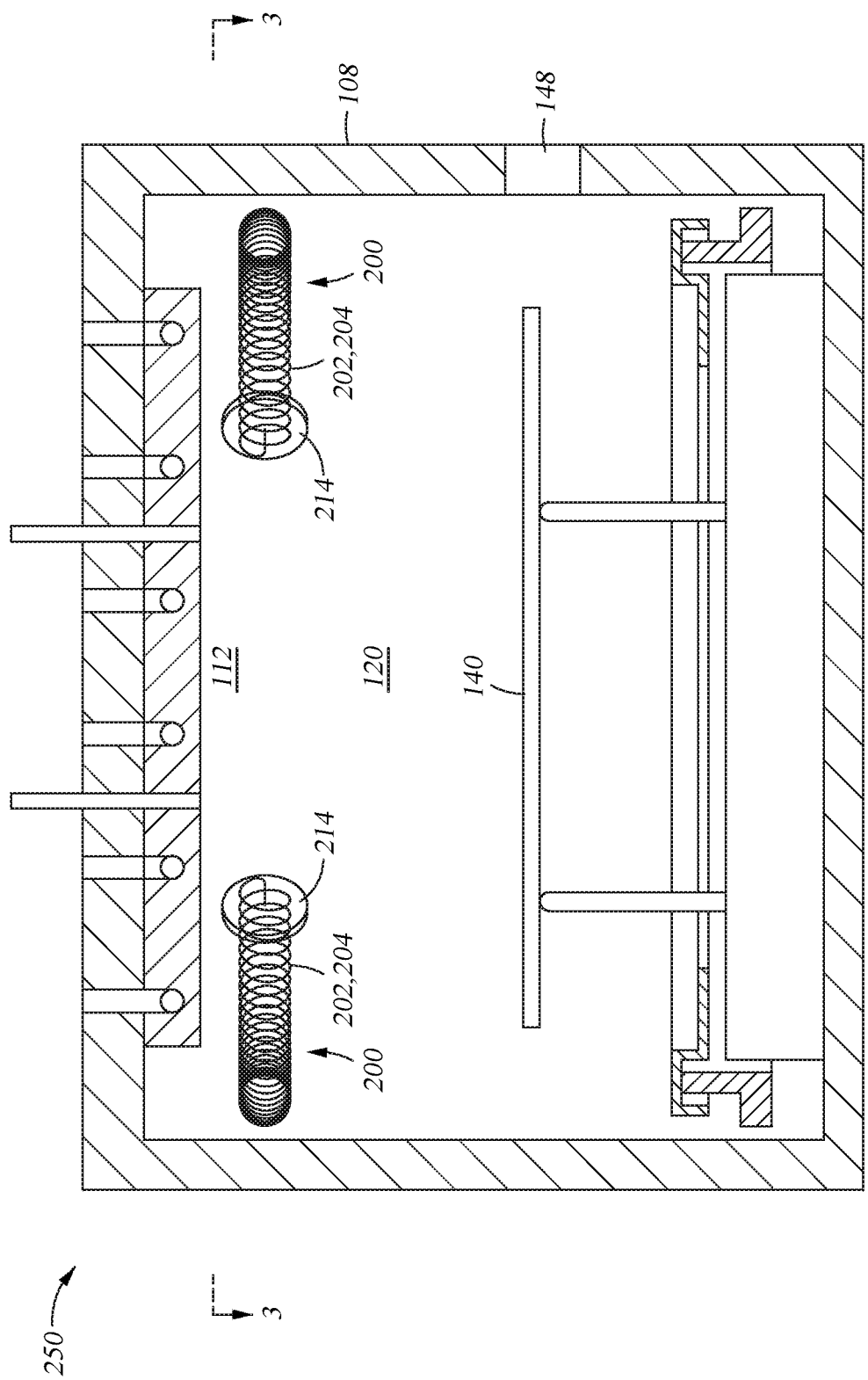
FIG. 2 shows a side view of a getter assembly inside the processing chamber.
Figure 3:
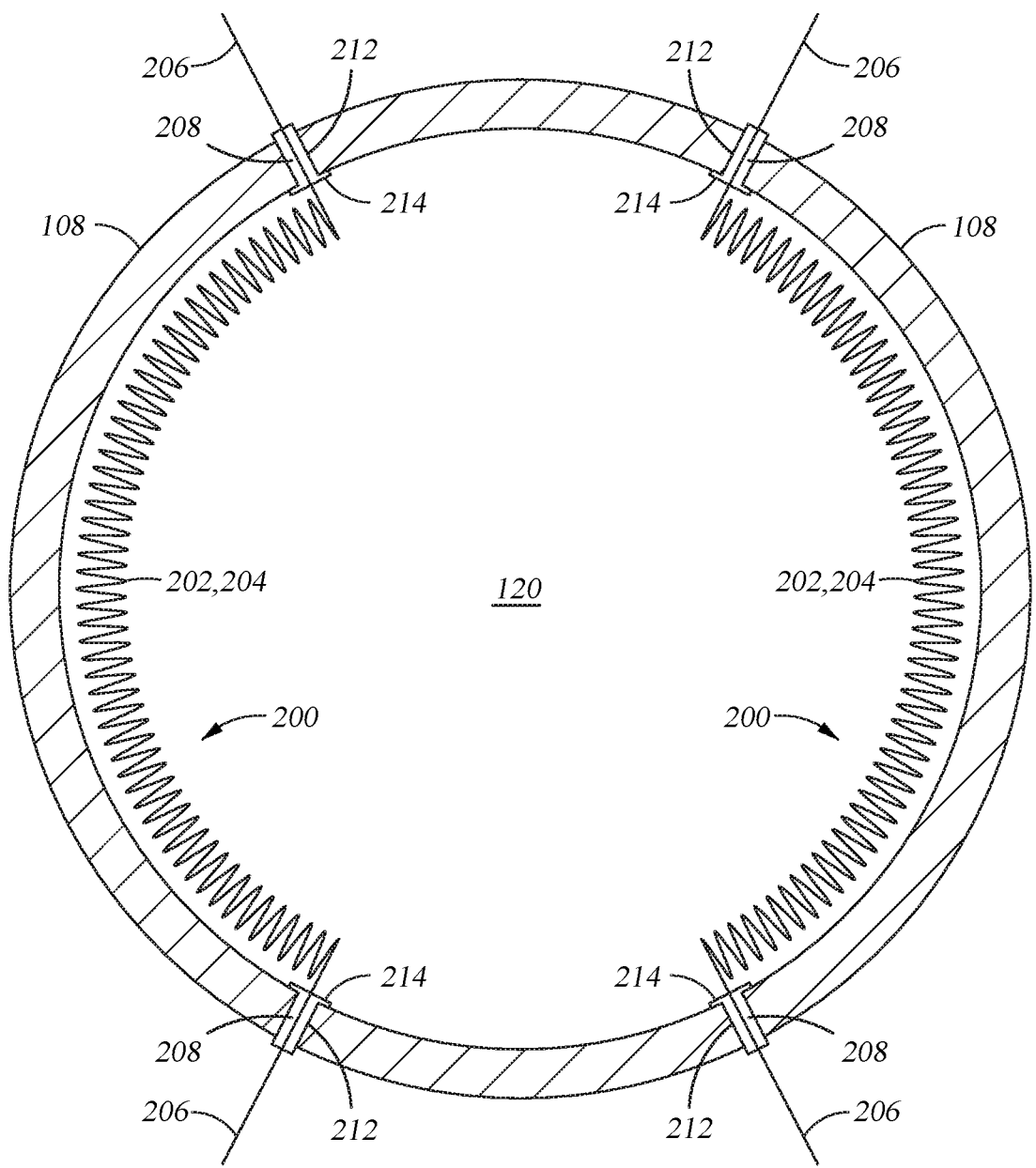
FIG. 3 is a top view of the getter assembly inside the processing chamber taken along an axis 3-3 of FIG. 2.
Figure 4:
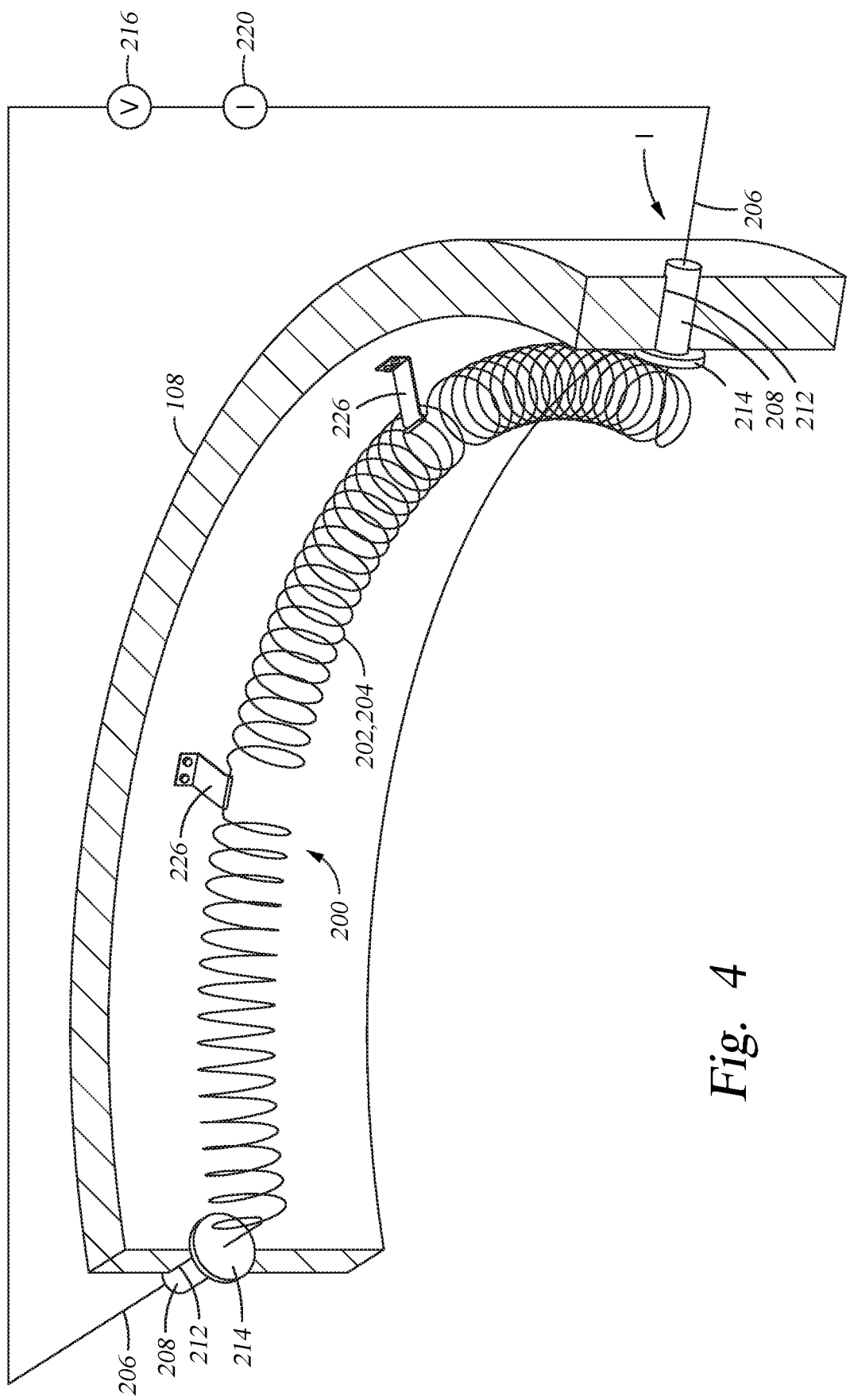
FIG. 4 is a perspective view of one getter embodiment comprising a stand-alone getter.
Figure 5:
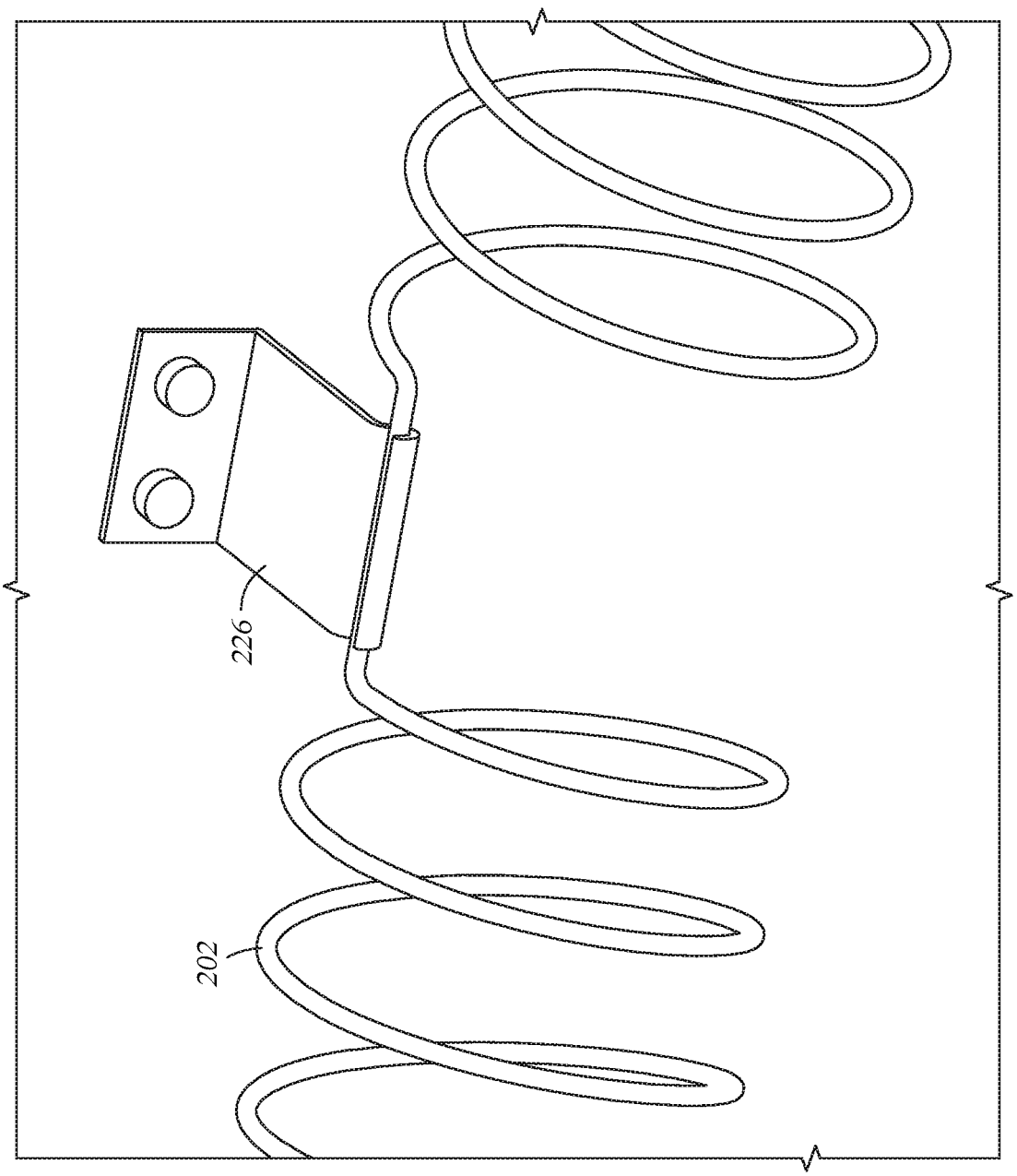
FIG. 5 shows a hook-like supports cantilevered from a getter coil to a side wall of the processing chamber.
Figure 6A:
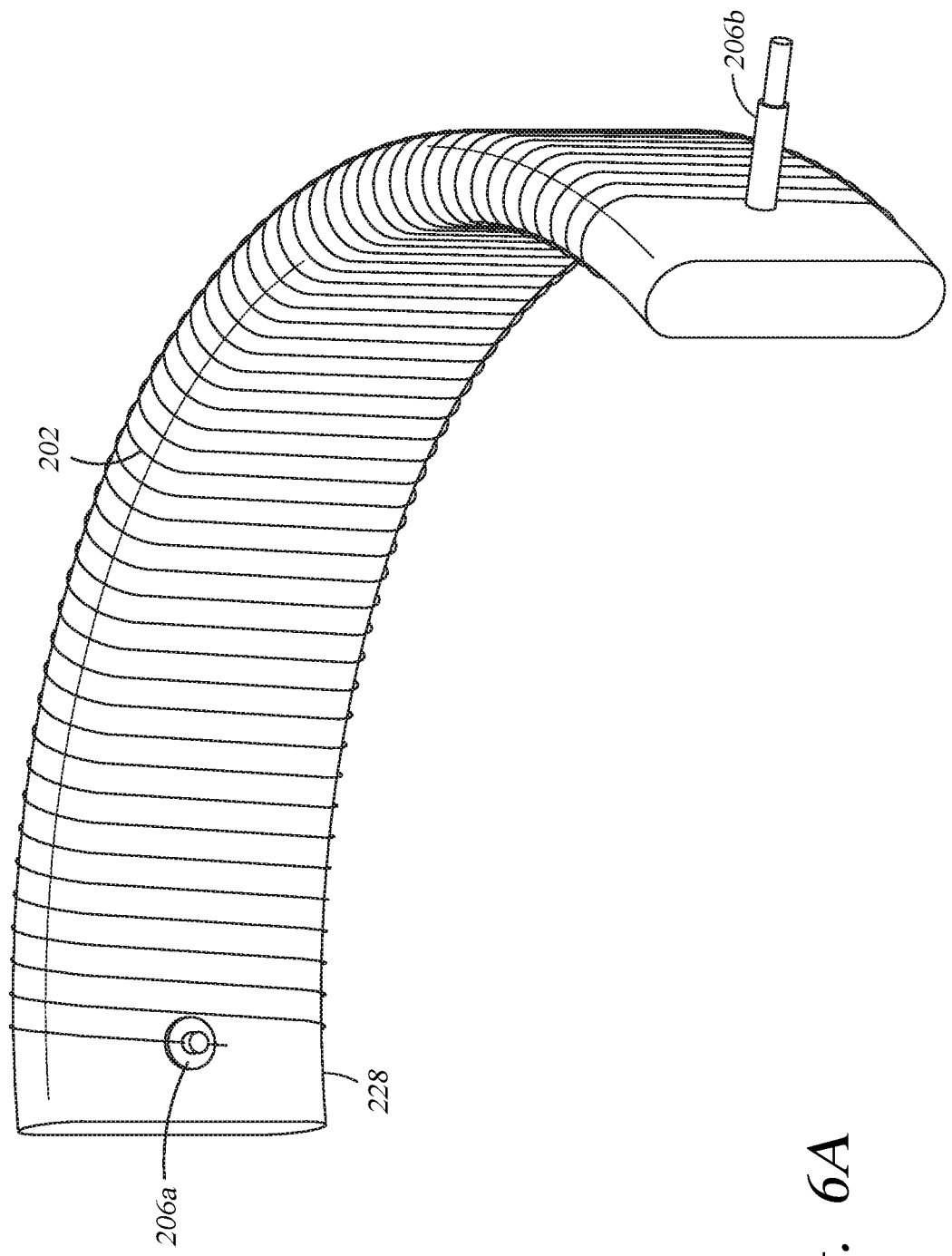
FIGS. 6A and 6B show an arcuate insulative support of elongated cross-section around which a getter coil is wound.
Figure 6B:
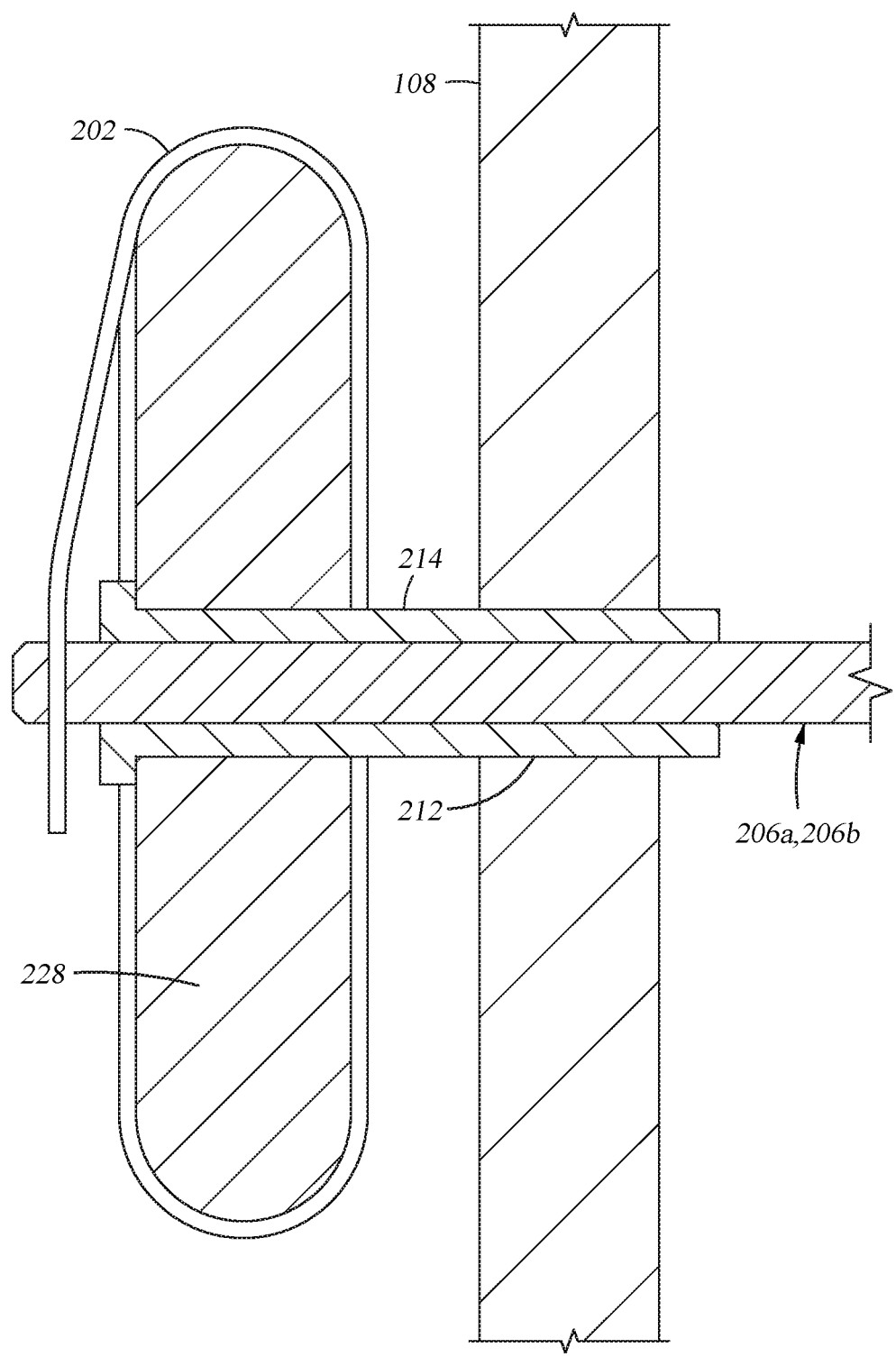
Figure 7A:
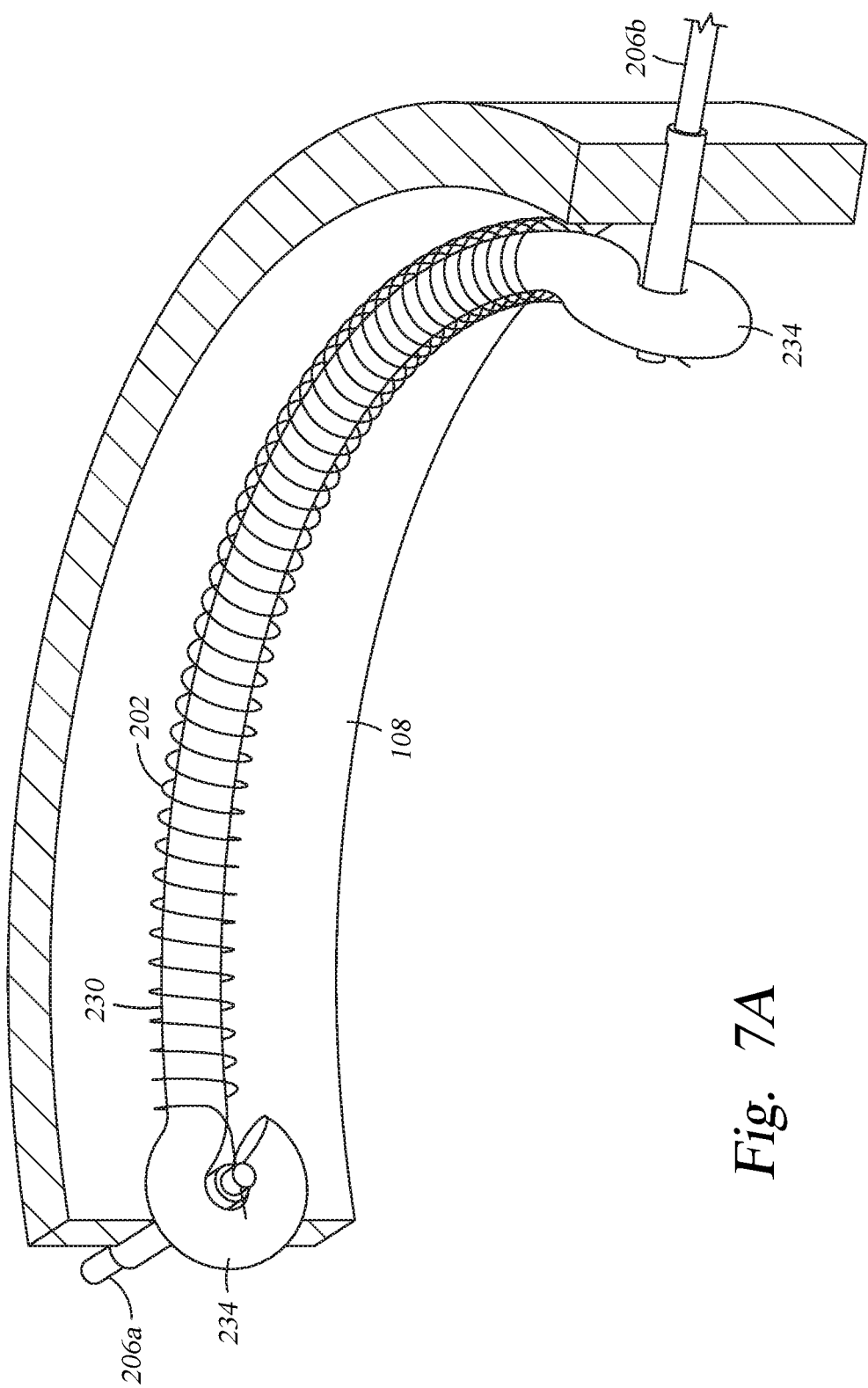
FIGS. 7A and 7B show another arcuate insulative support of circular cross-section around which a getter coil is wound.
Figure 7B:
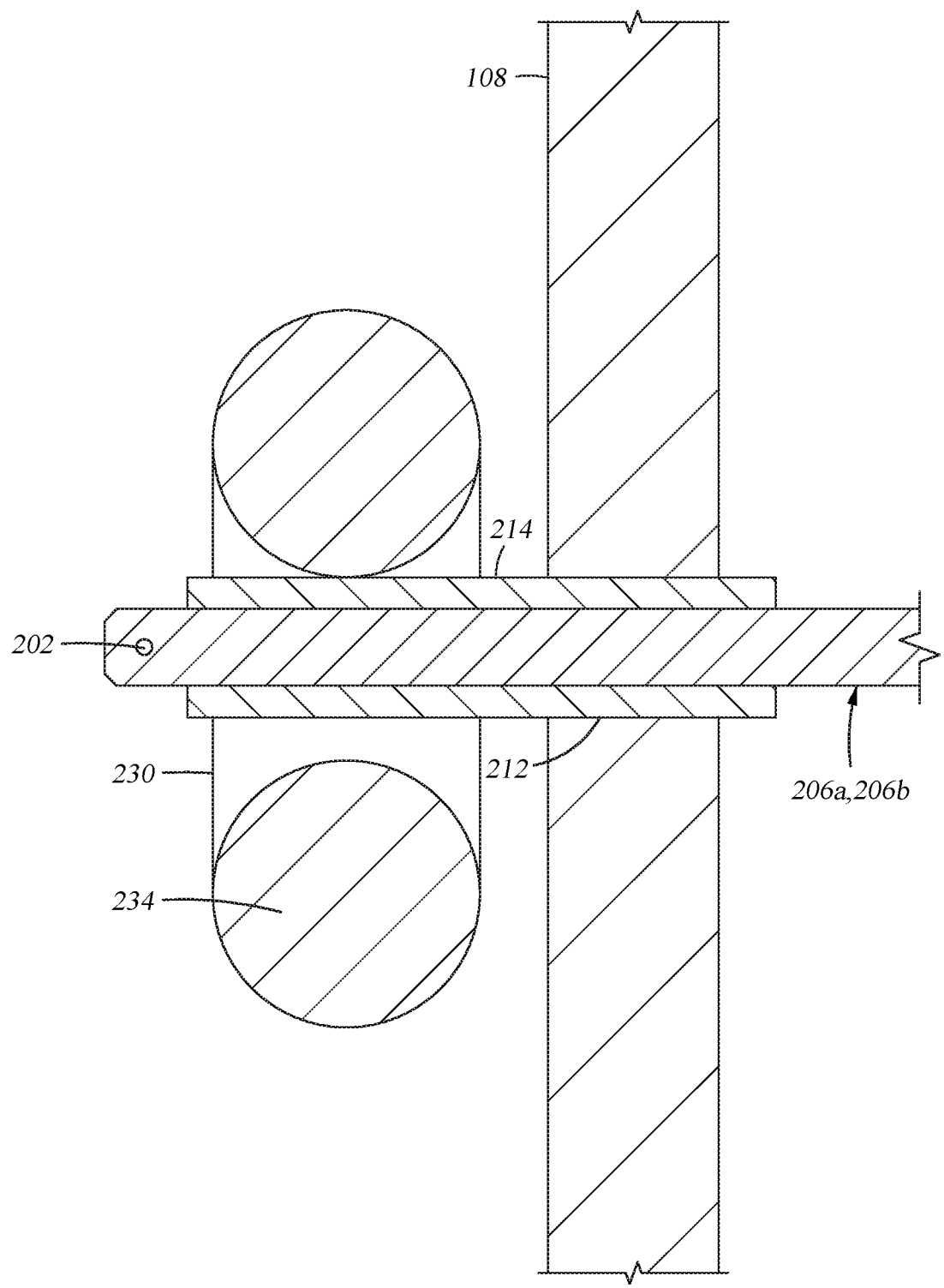
Figure 9:
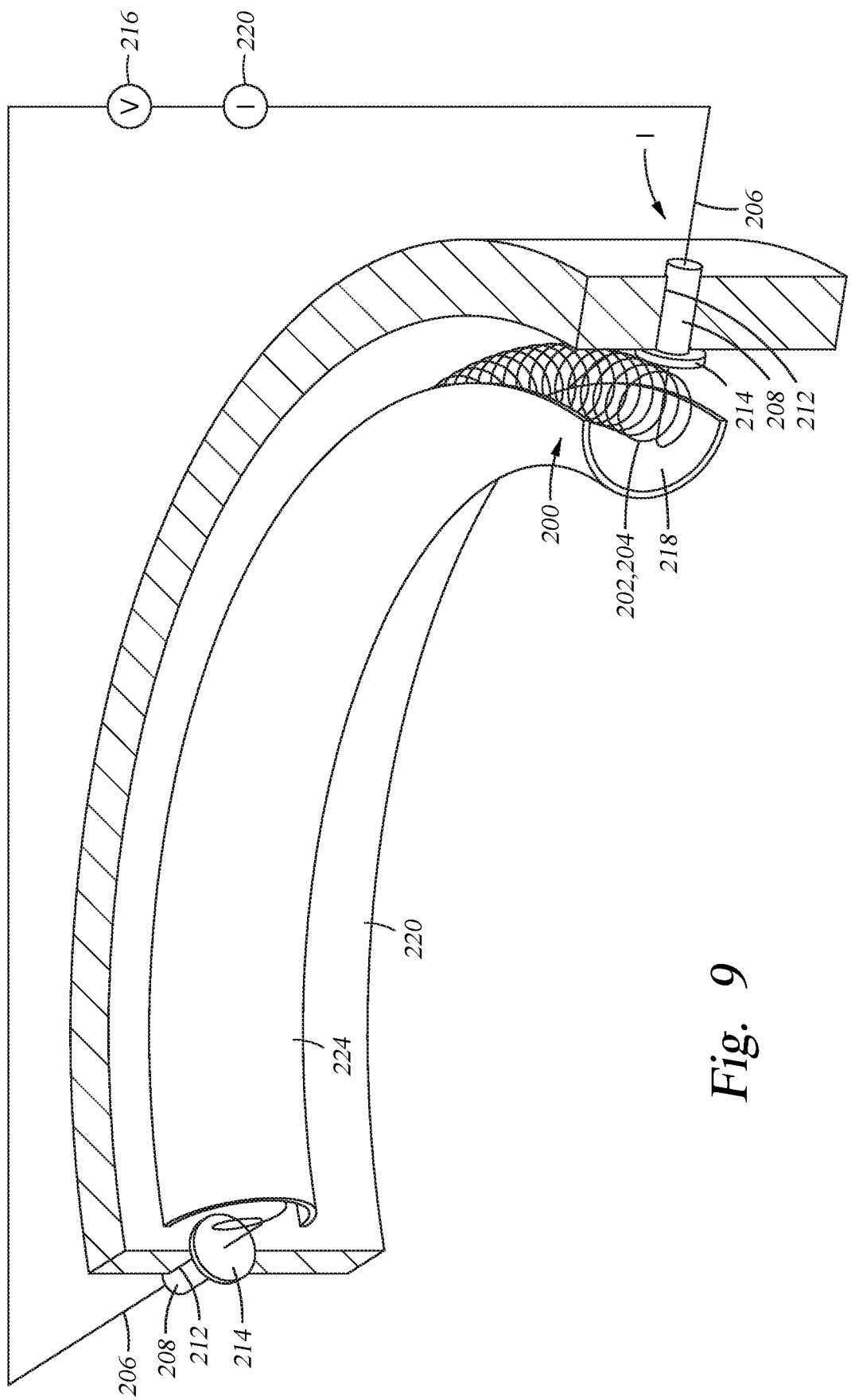
FIG. 9 shows a perspective view of a shielded getter coil embodiment.

FIG. 2 shows a cross-sectional view of a thermal processing chamber 250, according to another embodiment. The thermal processing chamber 250 includes a getter assembly 200 inside the thermal processing chamber 250, as shown in FIG. 1. FIG. 3 is a cross-sectional view of the thermal processing chamber 250 taken along axis 3-3 of FIG. 2. FIG. 3 shows the getter assembly 200 inside the thermal processing chamber 250. FIG. 4 is a perspective view of one getter embodiment comprising a stand-alone getter. FIG. 9 shows a perspective view of a shielded getter coil embodiment. In the embodiment shown in FIG. 2, the thermal processing chamber 250 includes getter assembly 200 that includes a getter 202 configured as a wire in a shape of a helical coil made of a getter material 204 disposed in the top portion 112 of the interior volume 120 of the thermal processing chamber 250 and extending into the interior volume 120 proximal to the side walls 108. The getter 202 is composed of a getter material 204 which removes oxidants to isolate the oxidizing species into a non-volatile or less reactive form. The getter 202 may be employed to react with oxygen, water, H2, and other oxidizing species. With respect to oxygen and water, exemplary getter materials include solid materials such as carbon, aluminum, tungsten, zirconium, hafnium, titanium, silicon, or an alloy of zirconium, etc. The getter 202 may be formed as wires, coils, foils, coupons, or ribbons.

Turning now to FIGS. 3 and 4, the getter assembly 200 may further include a pair of electrodes 206 coupled to corresponding ends 208 of the getter 202. The electrodes 206 may be fed through openings 212 in the side wall 108. In one embodiment, the electrodes 206 are free-standing and fed through the opening 212. In another embodiment (shown in FIGS. 3 and 4), the electrodes 206 may be insulatively fastened to the side wall 108 using an electrical-thermal insulator. In still another embodiment, the electrodes 206 may be fastened to the side wall 108 in the openings 212 with insulating screws (not shown). Each of the electrodes 206 is configured to receive a current I to resistively heat the getter 202 from a constant voltage source 216 external to the thermal processing chamber 250. A constant voltage V, resulting in a current I, measures by ammeter 220, is applied to the material to resistively heats the getter material 204 of the getter 202 until the getter material 204 reaches a temperature such that the getter material 204 is flashed from the getter 202 into the interior 120 of the thermal processing chamber 250 or until the material reaches a temperature such that its surface reacts rapidly with the oxidant. When the getter 202 has a resistance above a threshold value, the getter 202 may be replaced.

The getter assembly 200 may further include a pair of anti-shorting shields 214 formed on the side walls 108 of the thermal processing chamber 250 proximal to the openings 212 in the side wall 108. The purpose of the anti-shorting shield 214 is as follows. When the getter 202 and/or the thermal processing chamber 250 is resistively heated, some getter material 204 may flash from the getter 202 into the thermal processing chamber 250. The anti-shorting shield 214 forms a physical barrier provided by an elevation gap between the anti-shorting shield 214 and the side wall 108, and to some extent by the thickness of the anti-shorting shield 214.

The getter assembly 200 may further include additional supports, which may be one or more insulative hook-like supports 226 cantilevered from the side walls 108. Each of the insulative hook-like supports 226 may be made of an insulative material, welded or bolted to the side walls 108. In another example, the insulative hook-like support 226 may be made of a metal welded to the side walls 108 with an insulative hook (e.g., a ceramic tube with getter wire inside), or a metal attached to the getter 202 but attached to the side walls 108 by an insulative standoff (or, e.g., an insulating bolt). Each of the one or more insulative hook-like supports 226 may grasp a portion of the getter 202 and keep the getter 202 in place proximal to the side walls 108.

Figure 8A:
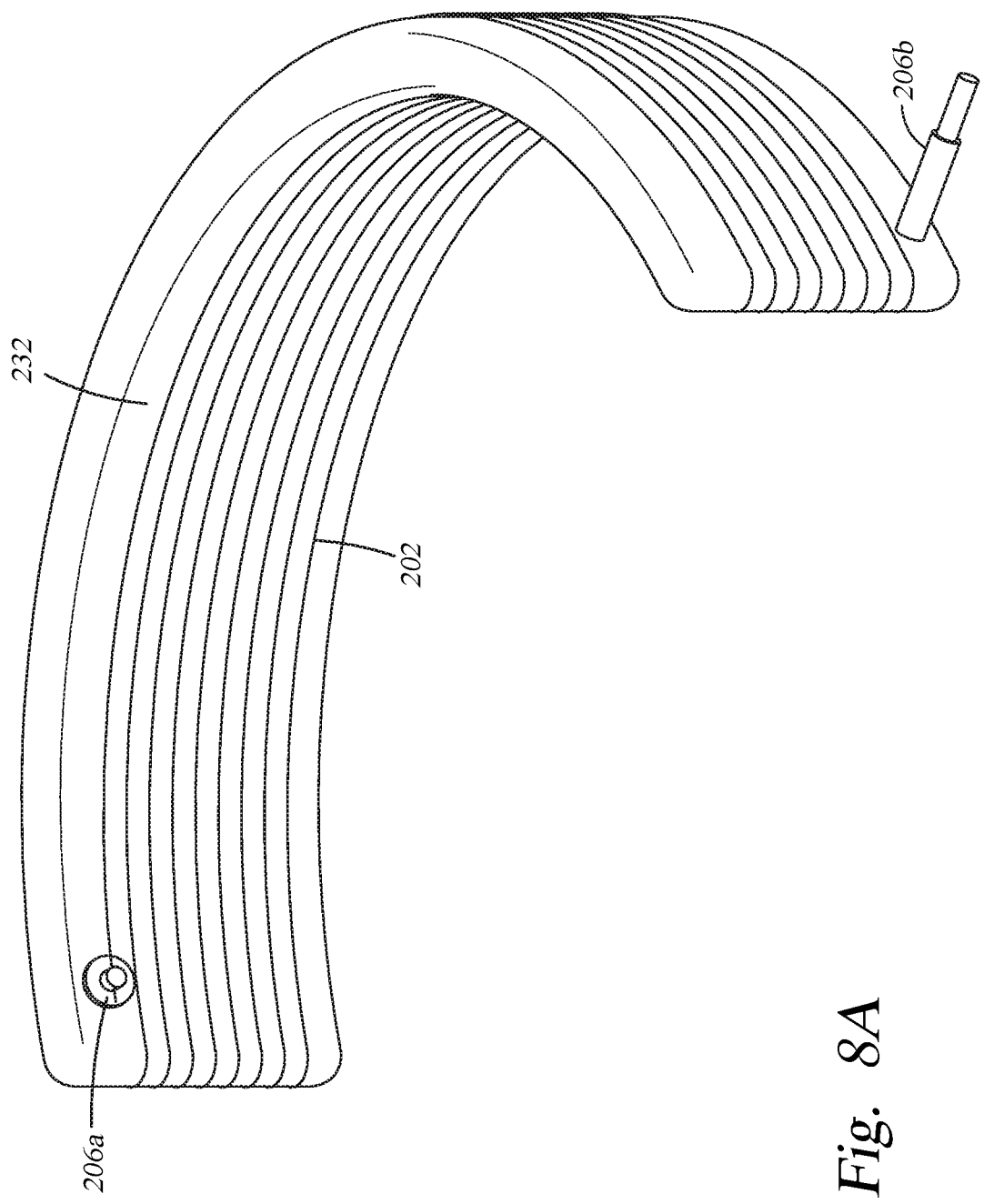
FIGS. 8A and 8B show a flat rectangular support around which a getter coil is wound along a horizontal axis.
Figure 8B:
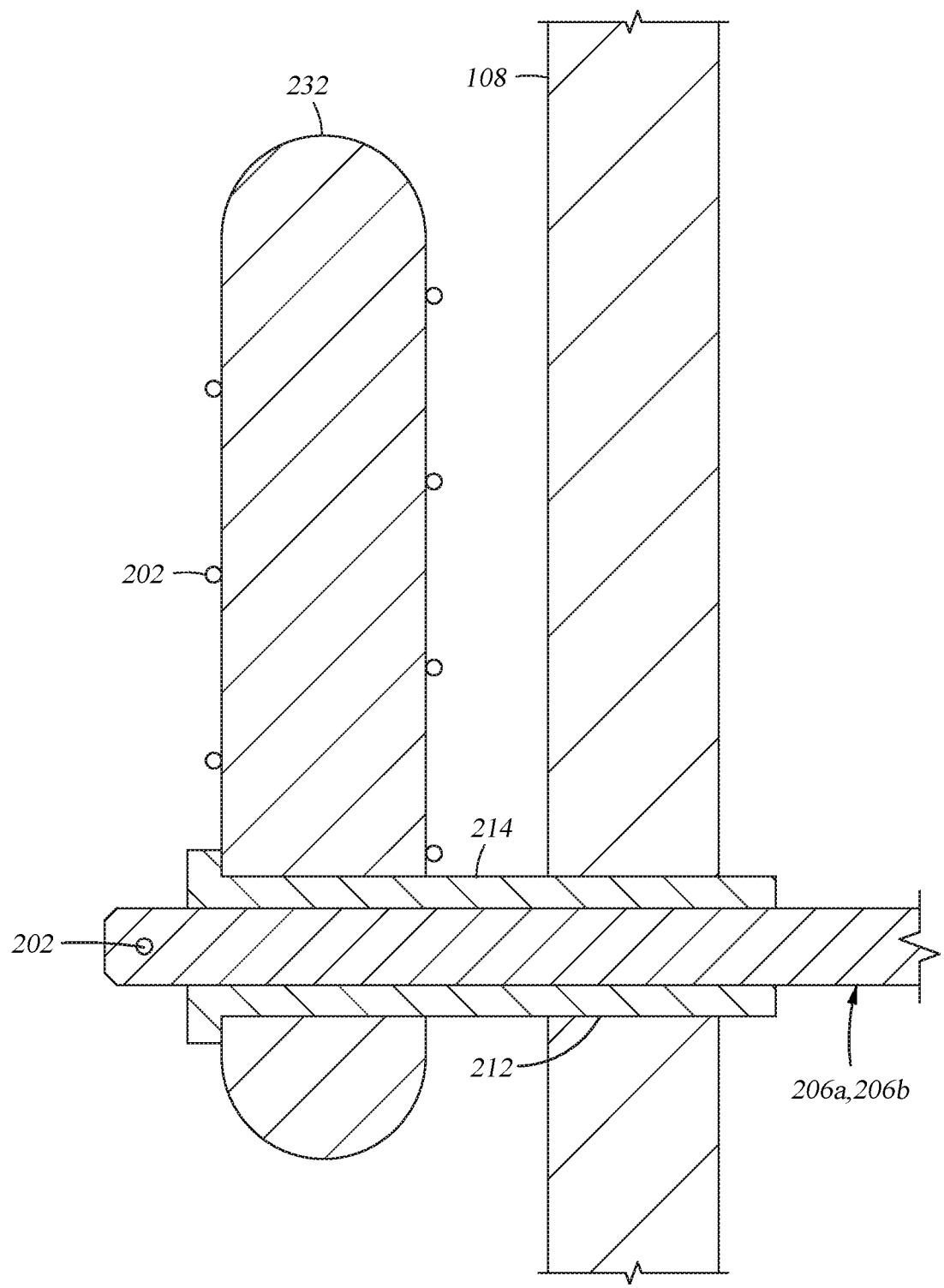

FIGS. 5-8B show other embodiments of insulative supports 228, 230, 232. In FIGS. 5-8B, insulative supports 228, 230, 232 may extend from one electrode 206a to the other electrode 206b through which the getter 202 may be fastened or suspended. FIGS. 6A and 6B show an arcuate insulative support 228 of elongated cross-section, with the getter 202 wrapped around the arcuate insulative support 228 near one of the electrodes 206. The getter 202 may be removeably fastened to the electrode 206a, so that the getter 202 may be replaceable after a number of operations. FIGS. 7A and 7B show another arcuate insulative support 230 of circular cross-section and having a hook portion 234 which may hook about the electrode 206a. FIGS. 8A and 8B show a flat rectangular support 232, wherein the getter 202 is removeably fastened to the flat rectangular support 232 along a longitudinal axis of the getter 202 rather than along a radial axis of the getter 202 as in FIGS. 5 and 6. The insulative supports 228, 230, 232 may be, in some embodiments, made of a ceramic material, e.g., silicon dioxide, aluminum oxide, zirconium oxide, or blends of ceramic materials such as mullite. In another embodiment, the insulative supports 228, 230, 232 may be made of a less conductive material than that of the getter 202, such as silicon carbide. In some embodiments, the supports 228, 230, 232 may include notches or posts located along the insulative supports 228, 230, 232 to be fastened to the side wall 108 to better mechanically position the getter 202 and serpentine arrangements of the supports 228, 230, 232 relative to the side walls 108.

Referring now to the embodiment of FIG. 9, the getter assembly 200 may further include an area shield 224 formed about the getter 202 to block the getter material 204 emitted by the getter 202 from forming on the substrate 140 or some portion of the side walls 108 of the thermal processing chamber 250. A surface area of the getter material 204 may be selected to gather a desired amount of oxidants or moisture. The area shield 224 may further prevent oxidants from interacting with a substrate 140 in the thermal processing chamber 250. Each time the getter 202 is heated, some of the material 204 of the getter 202 flashes on to an inner surface 218 of the area shield 224 instead of onto some portion of the interior surface 120 of the side walls 108 or a substrate (not shown) within the thermal processing chamber 250.

In another embodiment, the getter 202 (e.g., aluminum) may be formed into a tubular helical coil made of a less reactive getter electrically conducting material (e.g., tungsten). A wire made of a getter material 204 may be positioned in the interior of the tubular helical coil and connected to a power source as described above. When the wire is resistively heated, it melts, coats the tubular helical coil, and then become an active getter material.

The getter assembly 200 may further include an ammeter 220 coupled to the getter 202 for measuring a current flowing through the getter 202 external to the thermal processing chamber 250 and coupled to the controller 124. The resistance of the getter 202 can be monitored by the relation $V/I=R$. If the measured resistance, R, exceeds a threshold, the getter 202 may be replaced.

In an embodiment, the getter material 204 may be resistively heated by a current flowing through the getter 202 only during one or more pre-specified periods of time. In this way, the getter material 204 life can be extended by not having the getter 202 active during periods where the oxidant concentration in the thermal processing chamber 250 is high and can be effectively lowered by an initial gas purge, for example, when a new substrate is just brought in from an ambient air environment.

In another embodiment, the getter 202 may be composed of a porous material. The porous material may be, for example, zeolite. In another embodiment, the getter 202 may include a material adapted to be a molecular sieve. The molecular sieve may be composed of zeolite, carbon, a metal organic framework compound (MOF), or a silica-based zeolite. The porous material or molecular sieve is operable to trap oxidants within their molecular structure. Rather than emitting getter material 204 into the processing volume, as in embodiments described above, in this embodiment oxidants and moisture are passively removed from the space near the getter assembly 200, resulting in overall lowering of moisture and oxidant concentration in the processing volume. When these getter materials reach absorptive capacity, a heater (not shown) may be used to regenerate them in situ when the thermal processing chamber 250 is idle and the contaminants can be removed in a gas stream.

The getter 202 may be further provided with anti-shorting shields 214 located on the side walls 108 of the chamber body 102 within the interior volume 120 of the thermal processing chamber 250 proximal to openings 210 in the side wall 108. The getter assembly 200 may also include a current sensor coupled to the getter assembly 200 within the interior volume 120 of the thermal processing chamber 250 to measure the resistance of the getter coil as getter material is used by the relation $V/I=R$ (the smaller the amount of getter coil material, the higher the resistance). Getter resistance increases for metallic getters with both temperature and decrease in total mass of the getter 202.

In operation, when the getter 202 is resistively heated by current flowing through the getter 202 via the electrodes 206 from an external source of current 216 outside or inside the chamber 100, the getter 202 emits the getter material 204 into the interior volume 120 of the thermal processing chamber 250 or activates the getter material, binds with oxidants or moisture present in the interior volume 120 of the thermal processing chamber 250, and takes the oxygen or water out of the gas phase. In one example, the getter material 204 takes the oxidants or moisture out of the interior volume 120 of the thermal processing chamber 250 by forming an oxide film within the thermal processing chamber 250, or by dissolving the oxidants and moisture into the getter 202. In one example, the getter 202 may be formed of carbon. Carbon can be used as absorptive type of getter when in the form of an activated carbon, as a surface reaction type forming more stable gaseous CO and $CO_2$. Theoretically, carbon can also be used as an emission type getter, forming $C_3$ and $C_1$ gaseous species if heated to over ~3000° C. Carbon is best used as a getter when heated to about ~800° C. to react with oxidants in the gas phase forming CO and $CO_2$. In reacting with oxygen, for example, the emitted carbon getter material 204 forms carbon monoxide. In another example, when the getter 202 is formed of a porous material such as a zeolite, the getter 202 absorbs oxygen or water molecules inside the porous material. The getter 202 may be a metal wire, such as aluminum wire and forms aluminum oxide with oxygen or water on a surface of the getter 202.

Figure 10:
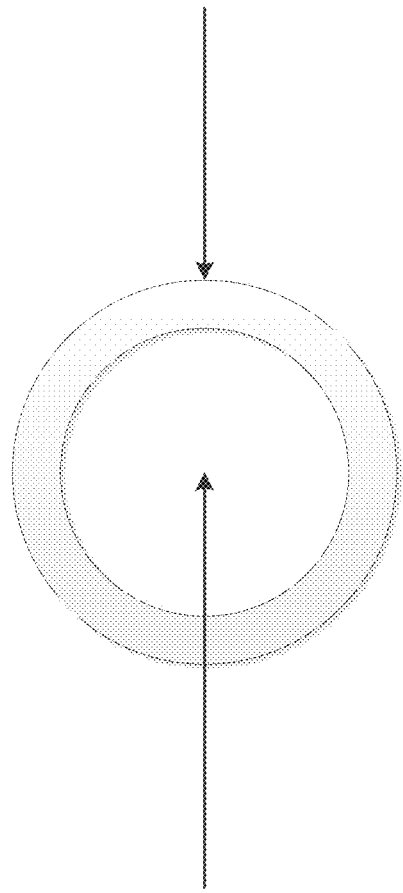
FIG. 10 shows a schematic view of a coiled helical tube having a wire of getter material therethrough.

In another embodiment such as depicted in FIG. 10, the getter 202 may be a coiled helical tube of tungsten having a thin aluminum wire feed therethrough. When the aluminum wire becomes hot through resistive heating of the tungsten, the aluminum wire melts and coats the tungsten and absorbs oxygen or water. Further heating of the tungsten wire vaporizes some or all of the aluminum inside the thermal processing chamber 250. The vaporized aluminum can also then bind with oxygen or water within the thermal processing chamber 250.

In another embodiment, the getter material inserted into the coiled helical tube may be a rod formed of a molecular sieve. The molecular sieve may also be formed into other various shapes. Molecular sieves are operable to better act as getters when the thermal processing chamber 250 is cool or when there is an exchange of pressure inside the thermal processing chamber 250. The molecular sieve may be made of zeolite or carbon, MOF, or other silica-based zeolite structure. Optionally, the coiled helical tube may be used to heat and regenerate the getter material during idle periods.

While the foregoing is directed to embodiments of the present invention, other and further embodiments of the invention may be devised without departing from the basic scope thereof, and the scope thereof is determined by the claims that follow:

What is claimed is:

1. A substrate processing apparatus, comprising:
    a thermal processing chamber having an interior volume, the thermal processing chamber including a top portion and a side wall; and
    a getter assembly comprising:
        an electrode extending into the interior volume from the side wall;
        an arcuate insulative support extending from the electrode; and
        a getter configured as a wire coupled to the electrode and disposed about the arcuate insulative support.

2. The apparatus of claim 1, wherein the getter is formed as one or more of a coil or a foil.

3. The apparatus of claim 1, wherein the getter assembly further comprises a pair of feedthrough electrodes coupled to the getter and fed through openings in the side wall.

4. The apparatus of claim 3, wherein the feedthrough electrodes are mounted to the side wall.

5. The apparatus of claim 3, wherein the getter assembly further comprises an anti-shorting shield disposed at each opening in the side wall.

6. The apparatus of claim 1, further comprising a large area shield formed about the getter to block getter material emitted by the getter from forming on a substrate or the side wall of the chamber.

7. The apparatus of claim 1, wherein the getter is formed as a coiled helical tube made of a non-getter material, wherein the apparatus further comprises a wire made of a getter material fed through an interior of the coiled helical tube.

8. The apparatus of claim 1, further comprising a resistance sensor in signal communication with the getter for measuring a resistance of the getter.

9. The apparatus of claim 1, wherein the getter is adapted to emit getter material into the interior volume of the chamber adapted to absorb one or more oxidants present in the interior volume during processing of a substrate.

10. The apparatus of claim 9, wherein the getter material is active to absorb oxidants during a pre-specified period of time.

11. The apparatus of claim 1, wherein the getter comprises a porous material.

12. The apparatus of claim 1, wherein the getter comprises a material adapted to be a molecular sieve.

13. The apparatus of claim 12, wherein the molecular sieve is made of a material selected from the group consisting of zeolite, carbon, metal organic framework (MOF), a silica-based zeolite.

14. The apparatus of claim 1, wherein the getter assembly further comprises one or more insulative supports for holding the getter in place proximal to the side wall.

15. The apparatus of claim 14, wherein the one or more insulative supports are one or more cantilevered hooks.

16. The apparatus of claim 14, wherein the one or more insulative supports are one or more arcuate cylinders of a ceramic material, wherein the getter is removably fastened to the insulative support along a radial axis of the getter.

17. The apparatus of claim 14, wherein the one or more insulative supports are one or more arcuate cylinders of a ceramic material, wherein the getter is removably fastened to the insulative support along a longitudinal axis of the getter.

18. A method, comprising:
    providing a thermal processing chamber having an interior volume which includes a top portion and a side wall;
    providing a getter assembly comprising:
        an electrode extending into the interior volume from the side wall;
        an arcuate insulative support extending from the electrode; and
        a getter configured as a wire coupled to the electrode and disposed about the arcuate insulative support; and
    resistively heating the getter to cause the getter to become active or to regenerate into the interior volume of the thermal processing chamber.

19. The method of claim 18, wherein the getter is formed as a helical wire coil.

20. A getter assembly comprising:
    an electrode extending, from a side wall of a substrate processing apparatus, into an interior volume of the substrate processing apparatus;
    an arcuate insulative support extending from the electrode; and
    a getter configured as a wire coupled to the electrode and disposed about the arcuate insulative support, the getter removably fastened to the electrode.

* * * * *

UNITED STATES PATENT AND TRADEMARK OFFICE
CERTIFICATE OF CORRECTION

PATENT NO. : 10,661,223 B2
APPLICATION NO. : 15/651669
DATED : May 26, 2020
INVENTOR(S) : Joseph M. Ranish Page 1 of 1

It is certified that error appears in the above-identified patent and that said Letters Patent is hereby corrected as shown below:

In the Claims

In Column 9, Line 44, in Claim 2, delete "coil or a foil." and insert -- coil. --, therefor.

In Column 10, Line 23, in Claim 15, after "more" insert -- arcuate --.

In Column 10, Line 25, in Claim 16, after "more" insert -- arcuate --.

In Column 10, Line 29, in Claim 17, after "more" insert -- arcuate --.

Signed and Sealed this
Eleventh Day of August, 2020

Andrei Iancu
*Director of the United States Patent and Trademark Office*